United States Patent [19]
Macomber

[11] Patent Number: 5,307,183
[45] Date of Patent: Apr. 26, 1994

[54] APPARATUS AND METHOD FOR FABRICATING A CURVED GRATING IN A SURFACE EMITTING DISTRIBUTED FEEDBACK SEMICONDUCTOR LASER DIODE DEVICE

[75] Inventor: Steven H. Macomber, Bethel, Conn.

[73] Assignee: Hughes Aircraft Company, Los Angeles, Calif.

[21] Appl. No.: 975,303

[22] Filed: Nov. 12, 1992

[51] Int. Cl.$^5$ .................. G02B 5/32; G02B 27/44; G03H 1/04; H01S 3/08

[52] U.S. Cl. .................... 359/11; 359/28; 359/30; 359/35; 372/49; 372/102

[58] Field of Search ............... 359/20, 28, 30, 19, 359/35, 11, 10; 372/49, 96, 102

[56] References Cited

U.S. PATENT DOCUMENTS

| | | | |
|---|---|---|---|
| 3,536,371 | 10/1970 | Post | 359/20 |
| 3,650,594 | 3/1972 | Nassenstein | 359/30 |
| 3,796,476 | 3/1974 | Frosch et al. | 359/30 |
| 3,941,450 | 3/1976 | Spitz et al. | 359/30 |
| 4,082,415 | 4/1978 | Brooks et al. | 359/20 |
| 4,597,630 | 7/1986 | Brandstetter | 359/30 |
| 4,807,978 | 2/1989 | Grinberg et al. | 359/20 |

*Primary Examiner*—Martin Lerner
*Attorney, Agent, or Firm*—Michael W. Sales; Wanda K. Denson-Low

[57] ABSTRACT

An apparatus 10 for exposing a curved grating pattern of monochromatic light on a photoresist coated semiconductor wafer 12 includes an argon gas laser 14 that outputs a monochromatic light beam 16. This monochromatic light beam 16 is filtered and collimated to produce a monochromatic light beam with a planar wavefront 24. A portion of this planar wavefront passes through a cylindrical lens array 26 and a first baffle slit 30, producing multiple cylindrical wavefront 34 that is incident upon a hypotenuse face 38 of a right angle prism 40. Another portion of the planar wavefront passes through a second baffle slit 32, producing a smaller planar wavefront 36 that is also incident upon the hypotenuse face 38 of the right angle prism 40. A destructive interference between a reflected multiple cylindrical wavefront 92 and a direct planar wavefront 90 inside the prism 40 produces a curved grating pattern of monochromatic light on an adjacent prism face 42. This curved grating pattern of monochromatic light is projected toward the semiconductor wafer 12, thereby exposing the photoresist coated wafer surface 48 with the curved grating pattern.

24 Claims, 2 Drawing Sheets

APPARATUS AND METHOD FOR FABRICATING A CURVED GRATING IN A SURFACE EMITTING DISTRIBUTED FEEDBACK SEMICONDUCTOR LASER DIODE DEVICE

BACKGROUND OF THE INVENTION

1. Field Of The Invention

The present invention generally relates to apparatus and methods for fabricating integrated circuits and, in particular, to an apparatus and method for fabricating a curved grating in a broad area surface emitting distributed feedback semiconductor laser diode device.

2. Description Of The Prior Art

Since the early 1970's, surface emitting laser diode devices having a variety of different waveguide grating structures have been explored. Of those explored, distributed Bragg reflector (hereinafter DBR) laser diode devices and distributed feedback (hereinafter DFB) laser diode devices have attracted the most interest. DBR laser diode devices have gratings at the ends of an electrically pumped region to provide a feedback of photon radiation back into the pumped region. DFB laser diode devices have a continuous grating along one side of an electrically pumped region to provide a feedback of photon radiation back into the pumped region. To date, mainly DBR devices have been demonstrated. However, due to a high thermal resistance from a substrate side heat sink bonding configuration, these devices have had to be operated in a pulsed mode. Furthermore, when manufacturing a DBR device, precision mechanical cleaving of the end gratings is required. More recently, DFB devices have been demonstrated. These devices offer the promise of reliable high-power continuous wave operation due to an epitaxial side heat sink bonding configuration. Furthermore, surface emitting DFB laser diode devices generally require only conventional integrated circuit fabrication techniques during their manufacture.

To date, surface emitting distributed feedback semiconductor laser diode devices have been fabricated with a second order linear grating etched into a cladding layer surface of a semiconductor wafer. This type of grating can be fabricated by creating an optical standing wave on a photoresist coated wafer surface using two-beam interference. The wafer is then subjected to an ion milling process and a chemical etching process to transfer the photoresist exposed grating pattern into the cladding layer surface of the wafer.

A surface emitting distributed feedback semiconductor laser diode device having a second order linear grating that is fabricated according to the above-described technique produces unidirectional, monochromatic, coherent visible light through stimulated emission in its semiconductor materials. Such a device has a positively doped side and a negatively doped side that are joined at a junction, and the second order linear grating is etched into an outer surface of the positively doped side. The surface of the grating, upon which a highly conductive material is disposed in order to create an electrically pumped region, provides a means by which coherent photon energy fields may be diffracted. The second order grating design permits deflections of coherent photon radiation to be directed normal to an output window etched into the negatively doped side of the junction through first order diffraction, and directed parallel to the surface of the grating through second order diffraction. The first order diffraction produces a beam of unidirectional, monochromatic, coherent visible light at the output window, whereas the second order diffraction provides a feedback of photon radiation to the electrically pumped region that is adjacent and parallel to the surface of the grating. Much has been 7ritten on the subject of surface emitting distributed feedback semiconductor lasers in recent years and some good descriptive background articles on these devices are *Surface Emitting Distributed Feedback Semiconductor Laser*, Applied Physics Letters, Volume 51, Number 7, pp. 472–474, August 1987, and *Analysis of Grating Surface Emitting Lasers*, IEEE Journal of Quantum Electronics, Volume 26, Number 3, pp. 456–466, March 1990.

Along the length of a surface emitting distributed feedback semiconductor laser diode device having a second order linear grating, a longitudinal mode near-field output intensity profile is double-lobed and anti-symmetric with a zero intensity null at the output window center. A corresponding longitudinal mode far-field output intensity profile is double-lobed and symmetric about the output window center. These longitudinal mode output intensity profiles have been substantiated in actual device measurements, although in these measurements it has been found that spontaneous emission partially fills the near-field intensity null at the output window center. Nonetheless, the longitudinal mode output intensity profiles associated with a surface emitting distributed feedback semiconductor laser diode device having a second order linear grating are acceptable for many applications due to a consistent mode relationship between the first and the second /rder diffracted photon radiation along the length of the electrically pumped region.

Along the width of a surface emitting distributed feedback semiconductor laser diode device having a second order linear grating, however, a lateral mode near-field output intensity profile and a lateral mode far-field output intensity profile are not acceptable for many applications due essentially to self-guiding and filamentation effects. Such effects result in the lateral mode near-field output intensity profile having an increasing number of lobes as the width of the electrically pumped region increases. Furthermore, there is a 180° near-field phase shift between each near-field lobe. The corresponding lateral mode far-field output intensity profile displays a double-lobed pattern centered about the location of each 180° near-field phase shift.

The reason that the lateral mode output intensity profiles associated with a surface emitting distributed feedback semiconductor laser diode device having a second order linear grating are not acceptable for many applications is that it is often required that the width of the electrically pumped region be increased, or a broad area electrically pumped region be created, in order to increase the output beam power of the device. Such an increase in the width of the electrically pumped region, although allowing an increase in the power applied to the device, will result in an increase in the number of lateral mode far-field lobes, which is unacceptable for many applications. It is therefore desirable to create a broad area surface emitting distributed feedback semiconductor laser diode device that provides an increase in output beam power, while concentrating that output beam power into a single lateral mode far-field lobe.

SUMMARY OF THE INVENTION

The present invention contemplates a method for fabricating a second order curved grating in a broad area surface emitting distributed feedback semiconductor laser diode device. Such a grating is fabricated by first applying photoresist to one surface of a positively doped cladding layer of a semiconductor wafer. The photoresist coated wafer surface is then optically contacted to an adjacent face of a right angle prism with index of refraction matching fluid. A two-slit baffle is placed in front of the hypotenuse face of the right angle prism such that a line normal to the hypotenuse face intersects a center point between the two baffle slits and the right angle of the prism. Also, the widths of the two slits are such that when added together the sum is less than the length of the hypotenuse face of the right angle prism.

A cylindrical lens array is placed in front of a first baffle slit on the side of the baffle that is opposite the prism. A collimated light beam is directed perpendicular to the two-slit baffle and cylindrical lens array arrangement. A portion of the collimated beam passes through the cylindrical lens array and the first baffle slit to produce a multiply cylindrical wavefront that is incident upon a portion of the hypotenuse face of the prism. Another portion of the collimated beam passes through a second baffle slit allowing a planar wavefront to be incident on another portion of the hypotenuse face of the prism. A destructive interference inside the prism between the multiply cylindrical and planar wavefronts creates a curved grating pattern that is exposed on the photoresist coated wafer surface. Once exposed, the wafer is subject to an ion milling process and a wet chemical etching process so as to produce a desired grating profile depth and a smooth grating surface, respectively.

The inclusion of this curved pattern in the second order grating enables the broad area laser diode device to produce a predominantly single-lobed lateral mode far-field output beam intensity profile at relatively high power. A detailed description of how the inclusion of such a second order curved grating in a broad area surface emitting distributed feedback semiconductor laser diode device can achieve this result is included in the related and copending patent application Ser. No. 07/974,775, entitled, Curved Grating Surface Emitting Distributed Feedback Semiconductor Laser, filed on even date herewith and assigned to the assignee hereof.

Accordingly, one object of the present invention is to provide a method for fabricating a second order curved grating in a broad area surface emitting distributed feedback semiconductor laser diode device.

Another object of the present invention is to provide a second order curved grating in a broad area surface emitting distributed feedback semiconductor laser diode device such that the device produces a predominantly single-lobed lateral mode far-field output beam intensity profile at relatively high power.

Other objects and advantages will become apparent to those skilled in the art from the following detailed description read in conjunction with the appended claims and the drawings attached hereto.

BRIEF DESCRIPTION OF THE DRAWINGS

The drawings, not drawn to scale, include.

DETAILED DESCRIPTION OF THE INVENTION

Figure 1:
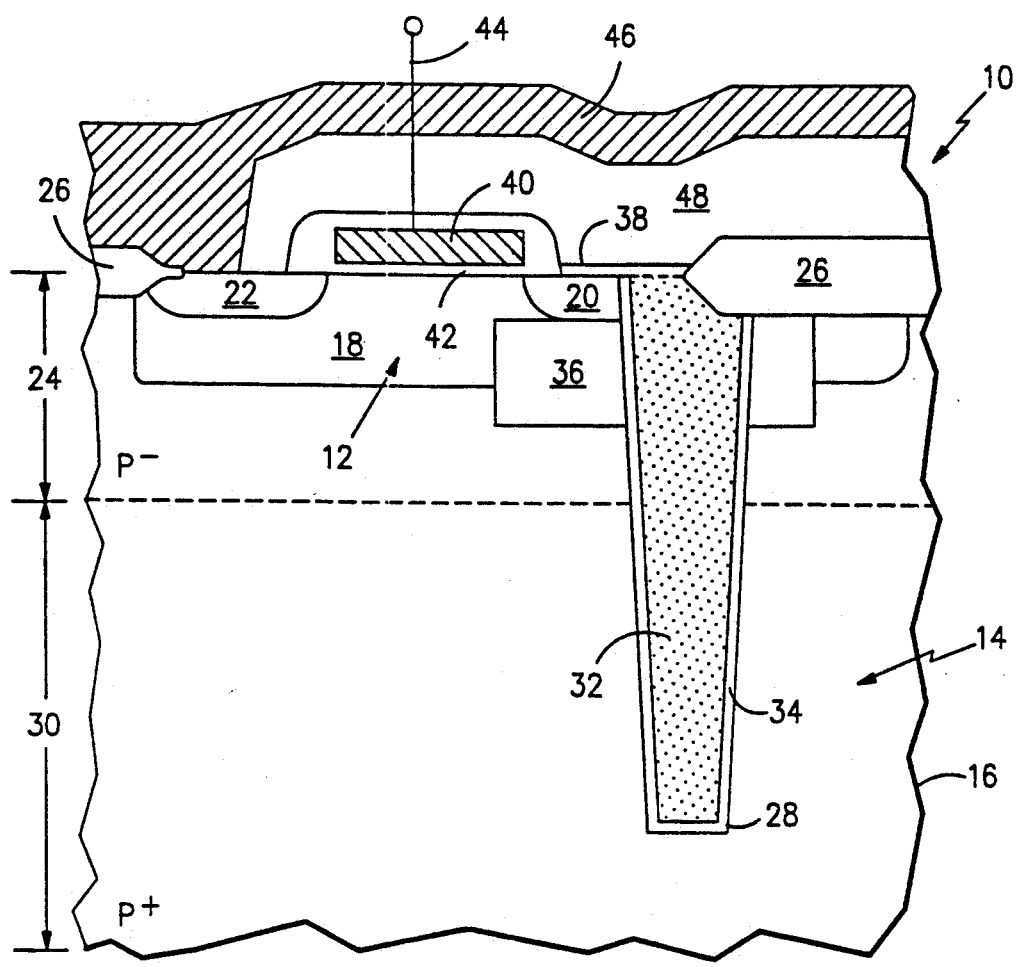
FIG. 1 is a top view schematic representation of an apparatus that exposes a curved grating pattern onto a surface of a semiconductor wafer.
Figure 2:
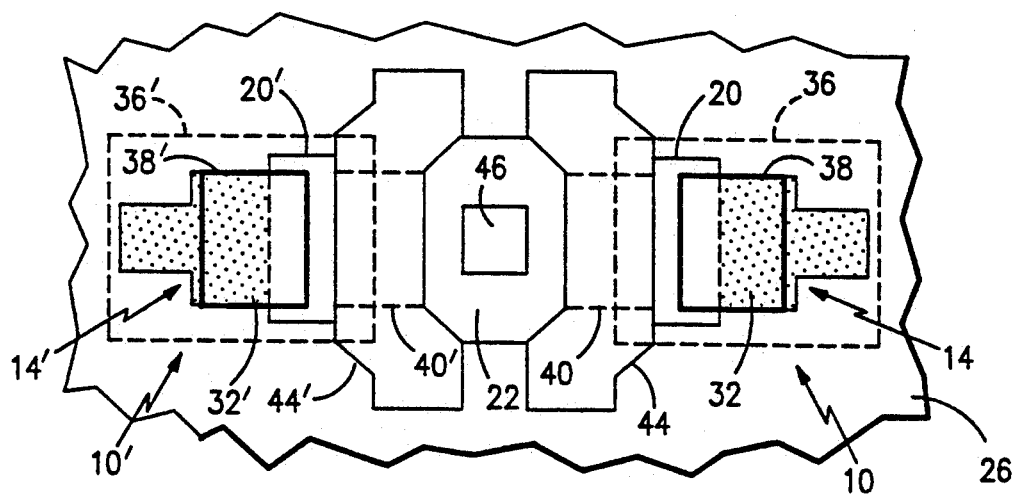
FIG. 2 is a side view schematic representation of the apparatus shown in FIG. 1.

Referring to FIGS. 1 and 2, there is shown an apparatus 10 that exposes a curved grating pattern of monochromatic light on a photoresist coated semiconductor wafer 12. In one embodiment, the apparatus 10 includes an argon gas laser 14 that outputs a monochromatic light beam 16 at a wavelength of 4880 Å, approximately 1 mm in diameter. This monochromatic light beam 16 is expanded and filtered using a conventional spatial filtering arrangement including a microscope objective lens 17 and a pinhole plate 18. This spatial filtering arrangement produces a diverging beam 20 that is passed through a collimator lens 22 whereby a monochromatic light beam with a planar wavefront 24 is produced.

A cylindrical lens array 26 is disposed in front of a first slit 30 of a two-slit baffle 28 at an angle of approximately 45° with respect to the planar wavefront 24. A portion of the planar wavefront passes through the cylindrical lens array 26 to produce a multiple cylindrical wavefront 34 that passes through the first baffle slit 30. Another portion of the planar wavefront passes through a second baffle slit 32 to produce a smaller diameter planar wavefront 36. The two-slit baffle 28 is placed in front of a hypotenuse face 38 of a right angle prism 40 such that the multiple cylindrical wavefront 34 is incident upon a first area 35 of the hypotenuse face, and the planar wavefront 36 is incident upon a second area 37 of the hypotenuse face. It should be noted that the baffle 28 may be tilted to reject any scattered light that may be reflected from the prism 40. It should also be noted that the cylindrical lens array 26 may be placed in front of either of the baffle slits 30,32. Further, the cylindrical lens array 26 may be either converging or diverging in nature. Inside the right angle prism 40, the multiple cylindrical wavefront 34 is reflected from a first adjacent prism face 44. A resulting reflected multiple cylindrical wavefront 92 destructively interferes with an unreflected planar wavefront 90, thereby creating a curved grating pattern of monochromatic light on a second adjacent prism face 42. This curved grating pattern of monochromatic light is projected through the second adjacent prism face 42 toward the semiconductor wafer 12. It should be noted that since the cylindrical lens array 26 may be placed in front of either of the baffle slits 30,32, as previously described, either the multiple cylindrical wavefront 34 or the planar wavefront 36 may assume the role of the reflected wavefront or the unreflected wavefront, as described above.

Figure 3:
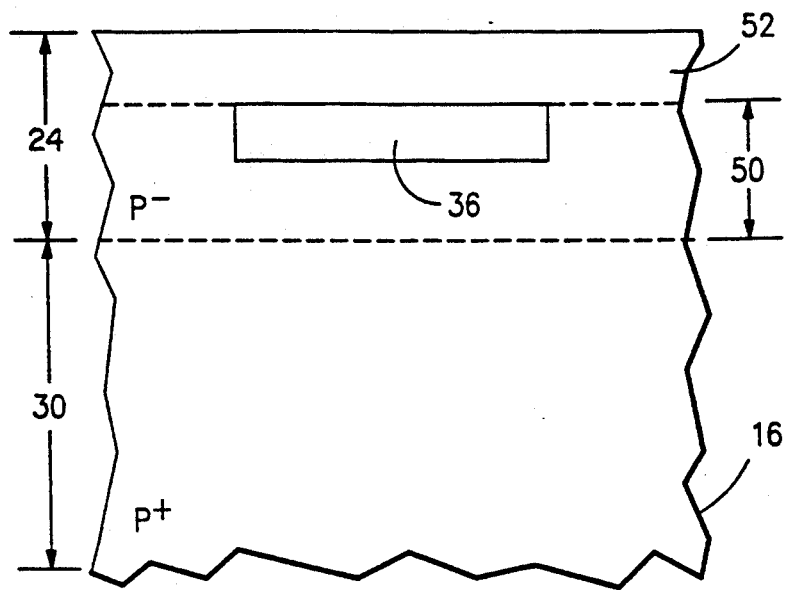
FIG. 3 is a cross-sectional plan view of a broad area surface emitting distributed feedback semiconductor laser diode device having a second order curved grating incorporated therein.

Referring the FIG. 3, there is shown a cross-sectional perspective view of a broad area surface emitting distributed feedback semiconductor laser diode device 50 having a second order curved grafting 52 incorporated therein. This laser diode device 50 is, for example, fabricated on a negatively (N) doped gallium and arsenic material compound (GaAs) substrate 54. A plurality of epitaxial layers are grown on this substrate 54 including a stop-etch layer 56, an N-doped GaAs layer 58, an N-doped aluminum, gallium, and arsenic material compound (AlGaAs) cladding layer 60, an N-doped AlGaAs confinement layer 62, an AlGaAs active layer 64, and a thin, positively (P) doped AlGaAs cladding layer 66. The curved grating pattern is exposed on a surface 48 of the P-doped AlGaAs cladding layer 66.

Referring again to FIGS. 1 and 2, the semiconductor wafer 12 consists of the GaAs substrate 54 and the epitaxial layers 56, 58, 60, 62, 64, 66 described above in FIG. 3. The orientation of this wafer 12 is indicated by the corresponding coordinate axes shown in all three of these figures. It should be noted that the wafer 12 and the cylindrical lens array 26 lie essentially parallel with one another to achieve the desired curved grating pattern, as will be described shortly.

The surface 48 of the P-doped AlGaAs cladding layer 66 is coated with a 100 nm thick mask of photoresist and optically contacted to the second adjacent face 42 of the right angle prism 40 with an index of refraction matching fluid. This index matching fluid is applied between the photoresist coated wafer surface 48 and the second adjacent prism face 42, and is used to inhibit reflections of light off the photoresist coated wafer surface 48 caused by light directed from the second adjacent prism face 42. By matching the index of refraction of the photoresist material to the index of refraction of the prism 40, the fluid eliminates a refractive index interface at the surface 48 of the photoresist coated AlGaAs cladding layer 66, thereby inhibiting reflections from this surface 48.

The curved grating pattern projected from the second adjacent prism face 42 is exposed onto an area of the photoresist coated wafer surface 48, wherein the size of this area is dependent upon the size of the prism 40. The size of the curved grating pattern within this area, however, is dependent upon the cylindrical lens array 26 and a Talbot imaging effect. The cylindrical lens array 26 preferably includes a multiple number of lenslets 46 which can be fabricated through a method known in the art. It can been determined from *High Power, Nearly Diffraction Limited Output from a Semiconductor Laser with an Unstable Resonator, IEEE Journal of Quantum Electronics*, Volume QE-27, 1991, that a radius of curvature, r, of each lenslet 46 should be on the order of 1.0 to 5.0 mm. The Talbot imaging effect leads to an image of the planar wavefront 24 as it is incident upon the cylindrical lens array 26 being replicated at the wafer surface 48. This image is contained in the reflected multiple cylindrical wavefront 92, which destructively interferes with the unreflected planar wavefront 90 to create the curved grating pattern of monochromatic light on the photoresist coated wafer surface 48. The Talbot imaging effect is invoked by positioning the cylindrical lens array 26 a Talbot distance, $d_t$, away from the wafer surface 48, as shown in FIG. 1. The Talbot distance can be expressed by the equation, $$d_t = 2D^2/\lambda,$$

where D is the center to center spacing of the lenslets 46 in the cylindrical lens array 26, and $\lambda$ is the wavelength of the monochromatic light beam 16. It should be noted that a cylindrical lens array 26 is used, rather than a single cylindrical lens, to create a multiplicity of side-by-side curved grating patterns, which makes the present invention practical for wafer level batch processing.

It should also be noted that it has been described in *AlGaAs Surface-Emitting Distributed Feedback Laser*, Proceedings of the SPIE, volume 893, 1988, that an optimal grating periodicity, represented by $\Lambda$, for a surface emitting distributed feedback semiconductor laser diode device with a uniform, or linear, grating and a AlGaAs active layer material is on the order of 0.24 $\mu$m. This optimal grating periodicity for a linear grating is also used as the optimal grating periodicity for the present invention curved grating.

Figure 4:
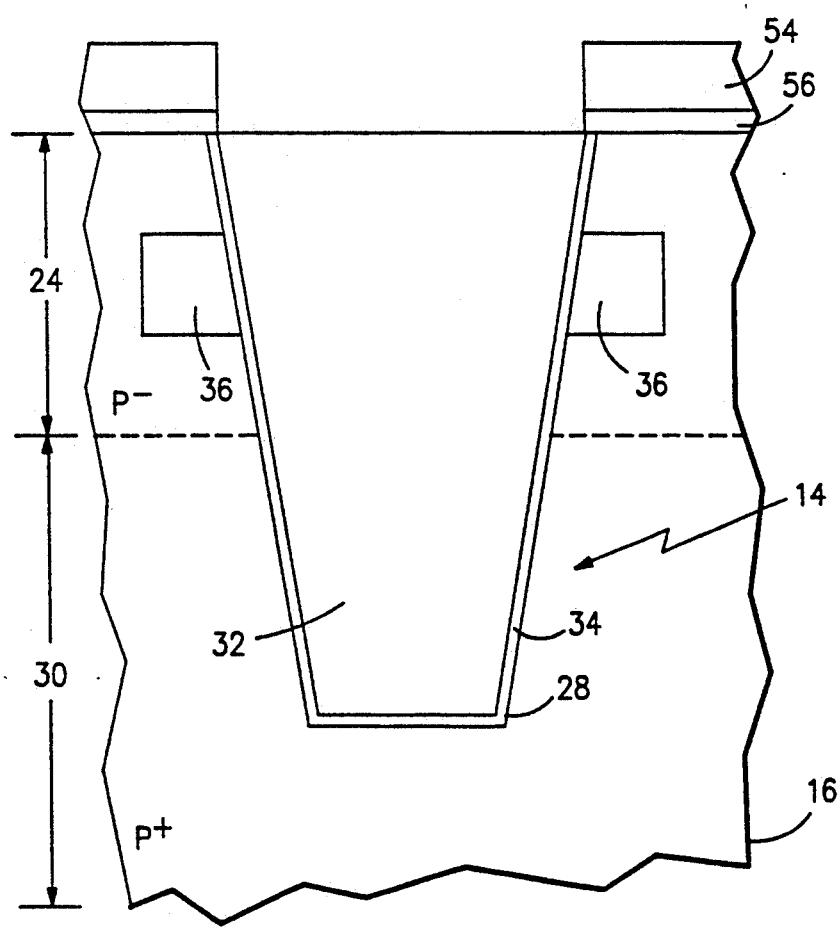
FIG. 4 shows a typical curved grating pattern according to the present invention.
Figure 1:
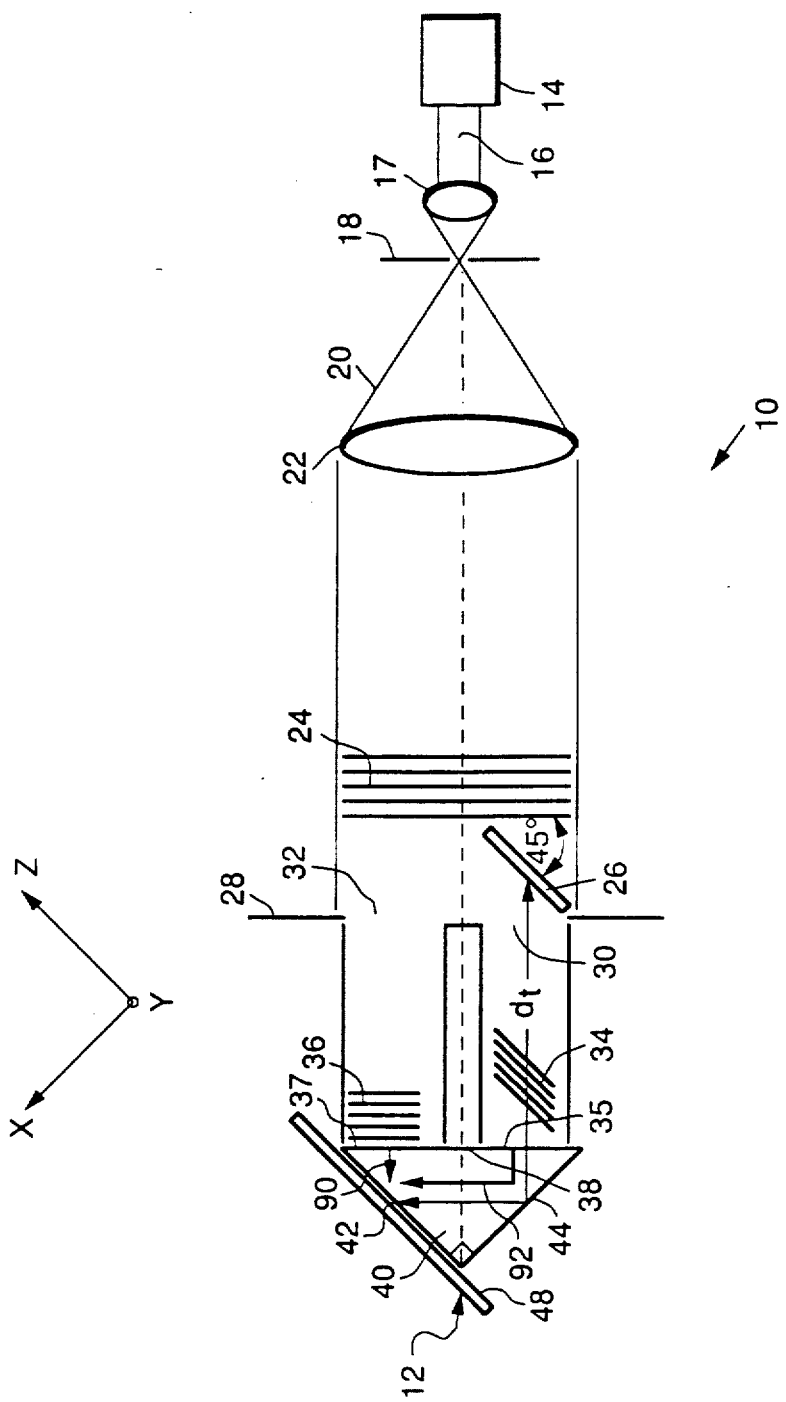
Figure 2:
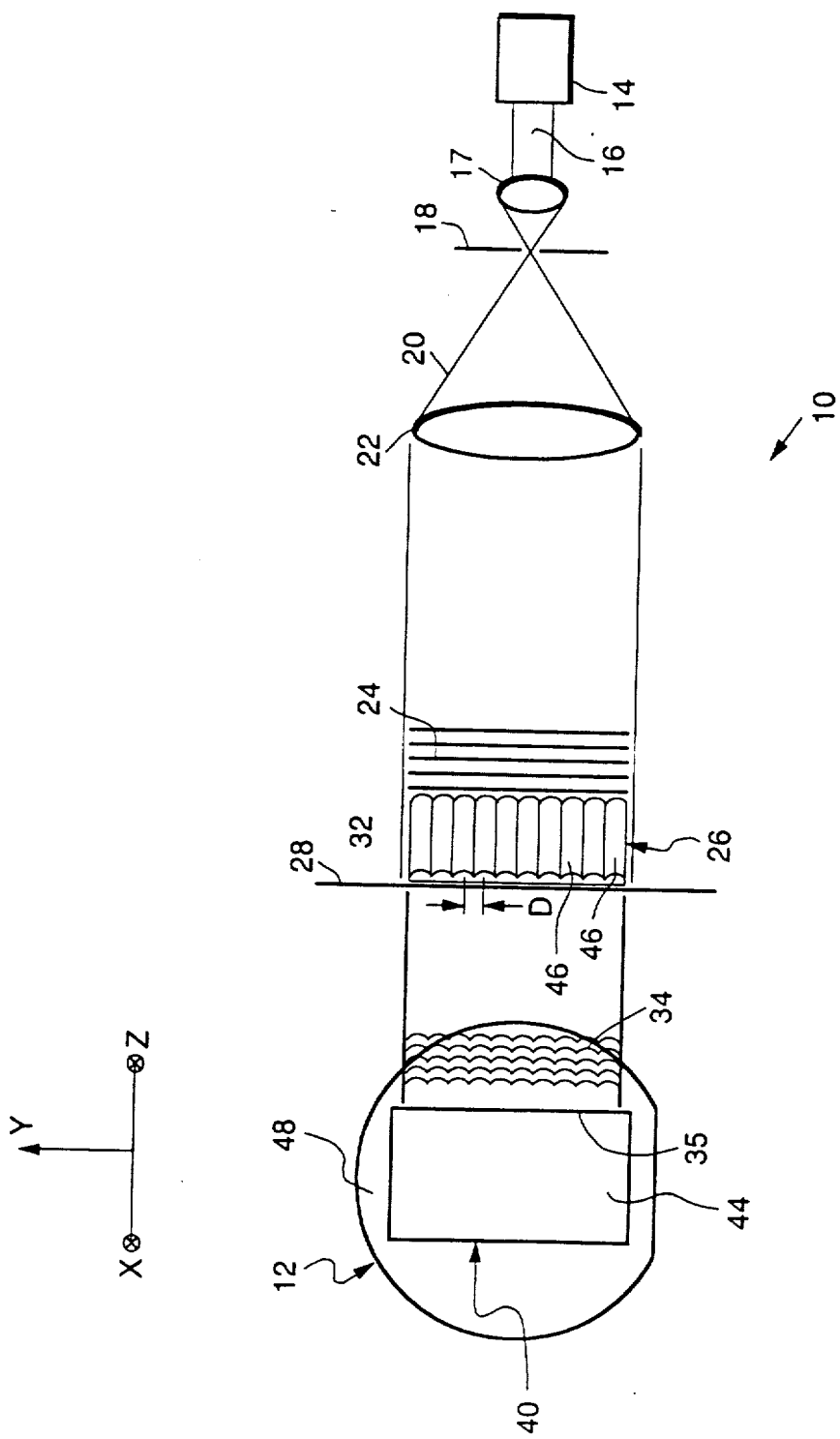
Figure 3:
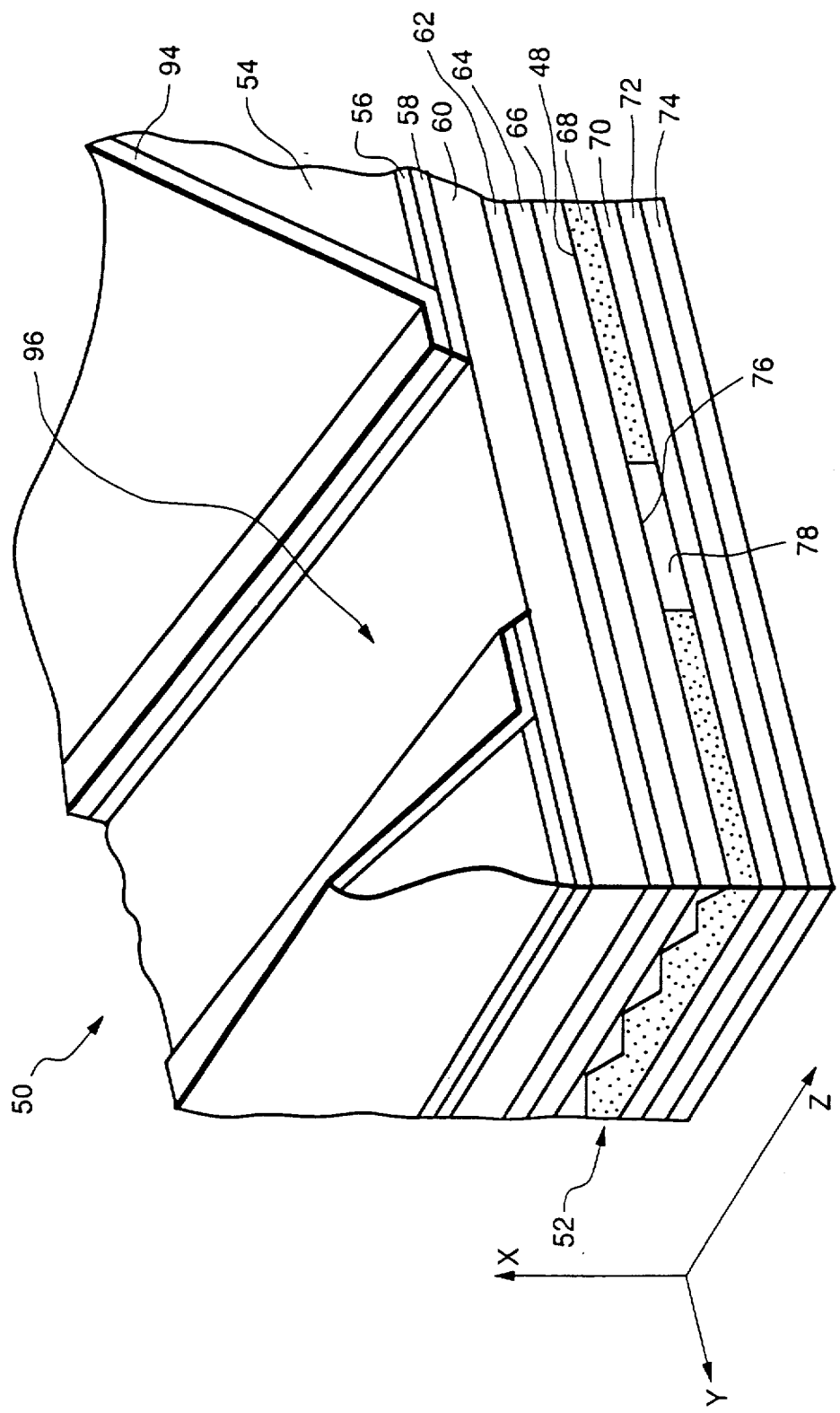
Figure 4:
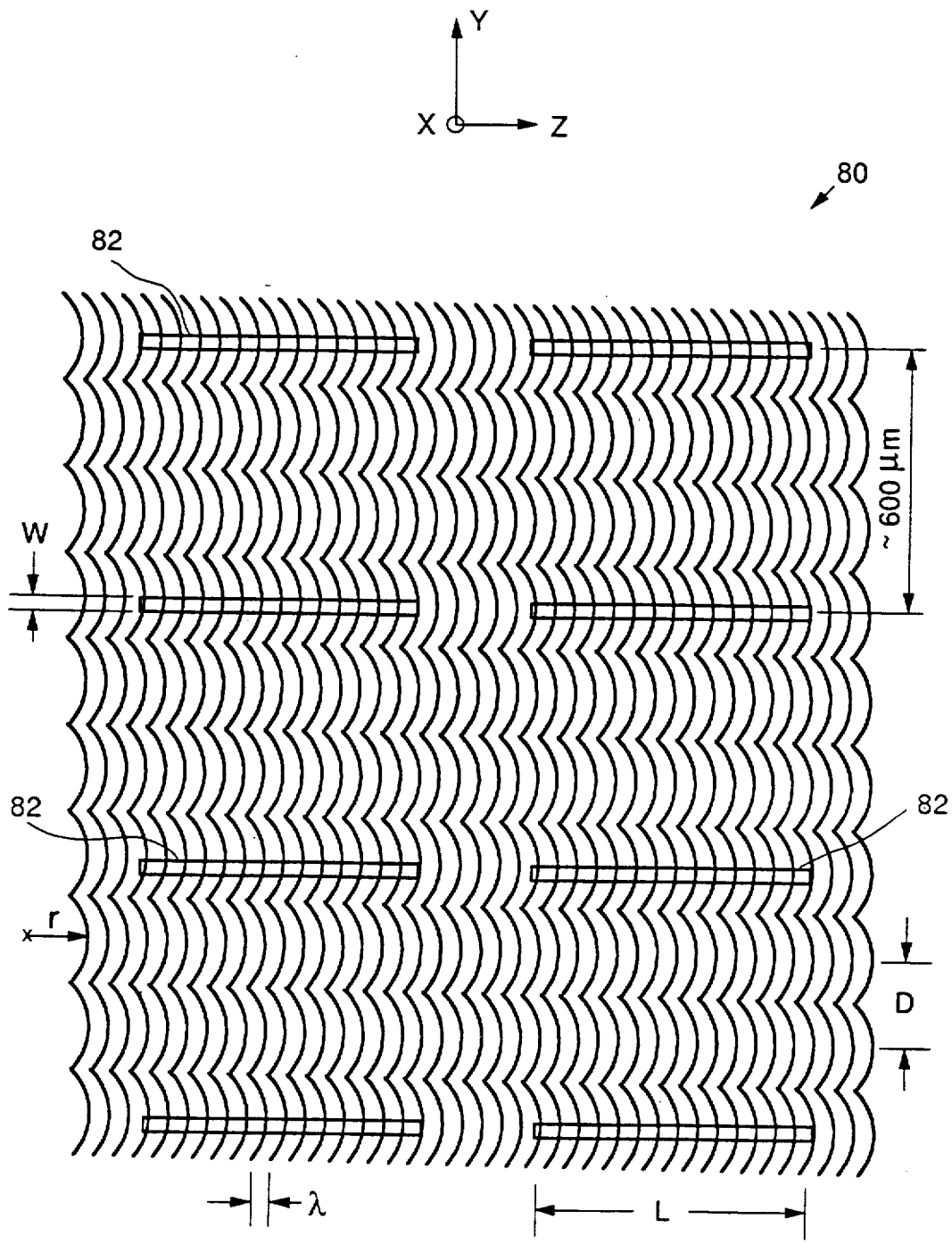

Referring to FIG. 4, there is shown a typical curved grating pattern 80 as it 7/uld be exposed on the photoresist coated wafer surface 48. Such a typical curved grating pattern 80 is formed with D=200 $\mu$m, $\lambda$=4880 Å, r=3 mm, and $\Lambda$=0.24 $\mu$m. Also shown are a number of striped regions 82 throughout the curved grating pattern 80. Each of these striped regions 82 corresponds to an electrically pumped region that will be formed within a single broad area surface emitting distributed feedback semiconductor laser diode device, as will be described shortly. Thus, these striped regions 82 are not part of the curved grating pattern 80, but are shown to illustrate typical laser diode device spacings throughout a typical curved grating pattern 80, which is shown to be approximately 600 $\mu$m. Such a striped region 82 will typically have length and width values of L=1500 $\mu$m and W=100 $\mu$m, respectively. The orientation of the grating pattern 80 shown is indicated by the coordinate axes, which correspond to those shown in FIGS. 1, 2, and 3. It should be noted that this figure is not to scale.

Referring back to FIGS. 1 and 2, once exposed, the wafer surface 48 is treated to an ion milling process to achieve a desired grating depth. This ion milling process consists of an atomic bombardment of the entire wafer surface 48 with accelerated argon ions. This broad area bombardment results in a depth removal of AlGaAs material from the grating pattern exposed sections of the P-doped AlGaAs cladding layer 66. It has been described in *Analysis of Grating Surface Emitting Lasers*, IEEE Journal of Quantum Electronics, Volume 26, Number 3, March 1990, that an optimal grating depth for a surface emitting distributed feedback semiconductor laser diode device with an linear grating, an AlGaAs active layer material, and a 0.24 $\mu$m grating periodicity, is 100 nm. This optimal grating depth for a linear grating is also used as the optimal grating depth for the present invention curved grating.

After the desired grating depth has been achieved through ion milling, the wafer 12 is treated to a wet chemical etching process. This chemical etching process serves to remove any damage to the crystal lattice structure of the P-doped AlGaAs cladding layer 66 material caused by the atomic bombardment. Also, this chemical etching process smoothes the surface of the ion milled grooves of the grating. The results of these processes is a second order grating surface with a curved pattern, or a second order curved grating 52.

Referring again to FIG. 3, once the second order curved grating 52 is fabricated into the P-doped AlGaAs cladding layer 66, a dielectric mask of silicon dioxide (SiO$_2$) 68 is deposited over the grating surface for isolation and current confinement. A stripe 78 is etched into the SiO$_2$ layer 68 down to a surface 76 of the grating 52, and gold (Au) metal is evaporated into this striped region 78 to provide an ohmic contact for the P-side of the laser diode structure 50. Barrier metal layers of chromium (Cr) 70, platinum (Pt) 72, and gold (Au) 74 are deposited over the gold stripe 78 and SiO₂ 68 regions to provide a low thermal resistance in the negative X-axis direction.

The N-doped GaAs substrate 54 is coated with photoresist and optically patterned and etched using standard fabrication techniques to produce a well, exposing the N-doped GaAs epitaxial layer 58. A gold, germanium, and nickel material compound (AuGeNi) layer 94 is deposited and annealed in the well to provide an ohmic contact for the N-side of the laser diode structure 50. Another photoresist mask is applied to the N-side contact 94 and an output window 96 is formed by standard pattern exposure and chemical etching techniques. This output window 96 allows a beam of photon radiation, deflected normal from the second order, gold-coated curved grating surface 76 through first order diffraction, to exit the laser diode device 50.

As previously discussed, the longitudinal mode output intensity profiles produced by a surface emitting distributed feedback semiconductor laser diode device 20 having a second order linear grating exhibits an antisymmetric near-field with a near zero intensity null at the lengthwise center of an output window, and a corresponding symmetric, double-lobed, far-field. The lateral mode output intensity profiles produced by the same surface emitting distributed feedback semiconductor laser diode device will have an antisymmetric near-field with a series of near zero intensity nulls along the entire width of the output window, and a corresponding symmetric, multi-lobed far-field.

In present invention, the longitudinal mode output intensity profiles produced by the broad area surface emitting distributed feedback semiconductor laser diode device 50 having the second order linear grating 52 incorporated therein will also have an antisymmetric near-field with a near zero intensity null at the lengthwise center of the output window 96, and a corresponding symmetric, double-lobed, far-field. The lateral mode output intensity profiles produced by this same broad area surface emitting distributed feedback semiconductor laser diode device 50, however, exhibits a more uniform near-field with no more near zero intensity nulls along the width of the output window 96, and a corresponding symmetric, single-lobed far-field. This desired single-lobed lateral mode far-field output intensity profile is achieved by suppressing self-guiding and filamentation effects which would otherwise be dominant in the device 50. It is expected that such a device 50 will concentrate approximately 1 Watt of power into this single lateral mode far-field lobe.

With the present invention fabrication apparatus 10 and method now fully described, it can thus be seen that the object set forth above are efficiently attained and, since certain changes may be made in the above-described apparatus 10 and method without departing from the scope of the invention, it is intended that all matter contained in the above description or shown in the accompanying drawings shall be interpreted as illustrative and not in a limiting sense.

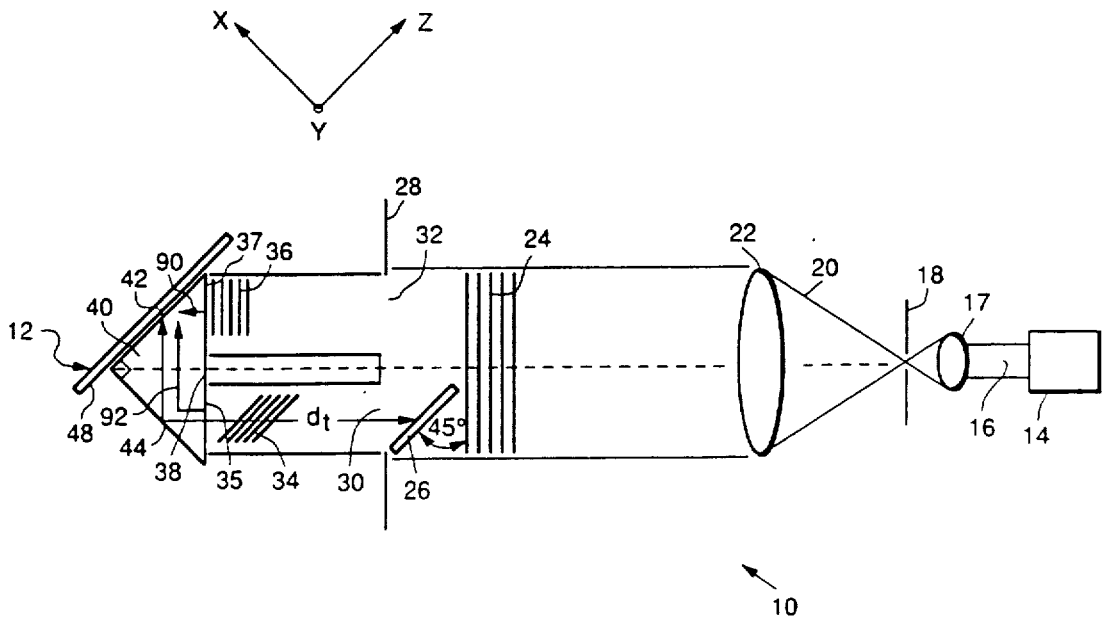

What is claimed is:

1. An apparatus for projecting a curved grating pattern onto a surface of a material, said apparatus comprising:
    means for providing a multiple planar wavefront of monochromatic light;
    means for providing a multiple cylindrical wavefront of monochromatic light, comprising:
    means for providing a monochromatic light beam;
    means for filtering said provided monochromatic light beam;
    means for collimating said filtered monochromatic light beam; and
    means for focusing said collimated and filtered monochromatic light beam toward multiple points on said material surface, comprising a cylindrical lens array having a plurality of lenslets, wherein said cylindrical lens array is positioned at an angle of approximately 45° with respect to said collimated and filtered monochromatic light beam, and wherein a surface of said cylindrical lens array is essentially parallel to said material surface; and
    means for providing a destructive interference between said planar wavefront and said multiple cylindrical wavefront, such that a curved grating pattern of monochromatic light is formed from this interference and projected onto said material surface.

2. The apparatus as defined in claim 1, wherein said means for providing a planar wavefront comprises:
    means for providing a monochromatic light beam;
    means for filtering said provided monochromatic light beam; and
    means for collimating said filtered monochromatic light beam.

3. The apparatus as defined in claim 2, wherein said means for providing a monochromatic light beam is an argon gas laser.

4. The apparatus as defined in claim 2, wherein said means for filtering is a spatial filter.

5. The apparatus as defined in claim 4, wherein said spatial filter comprises:
    a microscope objective lens; and
    a plate having a pinhole.

6. The apparatus as defined in claim 2, wherein said means for collimating said filtered monochromatic light beam is a collimator lens.

7. The apparatus as defined in claim 1, wherein said means for providing a monochromatic light beam is an argon gas laser.

8. The apparatus as defined in claim 1, wherein said means for filtering is a spatial filter.

9. The apparatus as defined in claim 8, wherein said spatial filter comprises:
    a microscope objective lens; and
    a plate having a pinhole.

10. The apparatus as defined in claim 1, wherein said means for collimating said filtered monochromatic light beam is a collimator lens.

11. The apparatus as defined in claim 1, wherein said cylindrical lens array is further positioned at a Talbot distance from said material surface, wherein said Talbot distance can be expressed by an equation, $$d_t = 2D^2/\lambda,$$

wherein D is a center to center spacing of said plurality of lenslets, and $\lambda$ is a wavelength of said monochromatic light beam.

12. The apparatus as defined in claim 1, wherein said means for providing a destructive interference comprises:
    a two-slit baffle; and
    a right angle prism.

13. The apparatus as defined in claim 12, wherein said two-slit baffle is placed in front of a hypotenuse face of said right angle prism, wherein a portion of said planar wavefront passes through a first slit of said two-slit baffle, and wherein a portion of said multiple cylindrical wavefront passes through a second slit of said two-slit baffle, such that said passed planar wavefront is incident upon a first area of said hypotenuse face and said passed multiple cylindrical wavefront is incident upon a second area of said hypotenuse face.

14. The apparatus as defined in claim 13, wherein said incident planar wavefront and said incident multiple cylindrical wavefront destructively interfere inside said right angle prism, and wherein said interference produces said curved grating pattern on an adjacent face of said right angle prism.

15. The apparatus as defined in claim 14, wherein said curved grating pattern is projected from said adjacent face of said right angle prism.

16. The apparatus as defined in claim 15, wherein said adjacent face of said right angle prism is optically contacted to said material surface.

17. The apparatus as defined in claim 16, wherein said optical contact is made through an index of refraction matching fluid, and wherein said index matching fluid is placed between said adjacent face of said right angle prism and said material surface.

18. The apparatus as defined in claim 17, wherein said material surface is a photoresist coated semiconductor wafer surface.

19. A method for fabricating a curved grating in a material surface, said method comprising the steps of:
    irradiating a first area of a hypotenuse face of a right angle prism with a planar wavefront;
    irradiating a second area of said hypotenuse face of a right angle prism with a multiple cylindrical wavefront; and
    optically contacting said material surface to an adjacent face of said right angle prism, such that a curved grating pattern is formed from a destructive interference between said planar wavefront and said multiple cylindrical wavefront and projected onto said material surface.

20. The method as defined in claim 19, wherein said step of irradiating with a planar wavefront includes the substeps of:
    providing a monochromatic light beam;
    filtering said monochromatic light beam;
    collimating said filtered monochromatic light beam; and
    directing said collimated and filtered monochromatic light beam onto said first area of the hypotenuse face of the right angle prism.

21. The method as defined in claim 19, wherein said step of irradiating with a multiple cylindrical wavefront includes the substeps of:
    providing a monochromatic light beam;
    filtering said monochromatic light beam;
    collimating said filtered monochromatic light beam;
    multiple focusing said collimated and filtered monochromatic light beam at a Talbot distance from said material surface; and
    directing said multiple focused, collimated and filtered monochromatic light beam onto said second area of the hypotenuse face of the right angle prism.

22. The method as defined in claim 19, wherein said step of optically contacting said material surface to said adjacent face of said right angle prism includes the step of applying an index of refraction matching fluid between said material surface and said adjacent face of said right angle prism.

23. The method as defined in claim 19, additionally including the step of applying a coating of photoresist to said material surface before optically contacting said material surface to said adjacent face of said right angle prism.

24. The method as defined in claim 19, additionally including the steps of:
    milling said material surface where said curved grating pattern is projected; and
    etching said milled material surface to remove damaged material and to provide a smooth grating surface.

* * * * *

UNITED STATES PATENT AND TRADEMARK OFFICE
CERTIFICATE OF CORRECTION

PATENT NO. : 5,307,183

DATED : Apr. 26, 1994

INVENTOR(S) : Steven H. Macomber

It is certified that error appears in the above-identified patent and that said Letters Patent is hereby corrected as shown below:

The title page, should be deleted to be replaced with the attached title page.

The drawing sheets, consisting of FIGS. 1-4, should be deleted and substitute therefor drawing sheets, consisting of FIGS. 1-4, as shown on the attached pages.

Signed and Sealed this

Sixteenth Day of January, 1996

Attest:

BRUCE LEHMAN

Attesting Officer

Commissioner of Patents and Trademarks

United States Patent [19]

Macomber

[11] Patent Number: 5,307,183
[45] Date of Patent: Apr. 26, 1994

[54] APPARATUS AND METHOD FOR FABRICATING A CURVED GRATING IN A SURFACE EMITTING DISTRIBUTED FEEDBACK SEMICONDUCTOR LASER DIODE DEVICE

[75] Inventor: Steven H. Macomber, Bethel, Conn.

[73] Assignee: Hughes Aircraft Company, Los Angeles, Calif.

[21] Appl. No.: 975,303

[22] Filed: Nov. 12, 1992

[51] Int. Cl.$^5$ .................... G02B 5/32; G02B 27/44; G03H 1/04; H01S 3/08
[52] U.S. Cl. ............................ 359/11; 359/28; 359/30; 359/35; 372/49; 372/102
[58] Field of Search ................... 359/20, 28, 30, 19, 359/35, 11, 10; 372/49, 96, 102

[56] References Cited

U.S. PATENT DOCUMENTS

| | | | |
|---|---|---|---|
| 3,536,371 | 10/1970 | Post | 359/20 |
| 3,650,594 | 3/1972 | Nassenstein | 359/30 |
| 3,796,476 | 3/1974 | Frosch et al. | 359/30 |
| 3,941,450 | 3/1976 | Spitz et al. | 359/30 |
| 4,082,415 | 4/1978 | Brooks et al. | 359/20 |
| 4,597,630 | 7/1986 | Brandstetter | 359/30 |
| 4,807,978 | 2/1989 | Grinberg et al. | 359/20 |

Primary Examiner—Martin Lerner
Attorney, Agent, or Firm—Michael W. Sales; Wanda K. Denson-Low

[57] ABSTRACT

An apparatus 10 for exposing a curved grating pattern of monochromatic light on a photoresist coated semiconductor wafer 12 includes an argon gas laser 14 that outputs a monochromatic light beam 16. This monochromatic light beam 16 is filtered and collimated to produce a monochromatic light beam with a planar wavefront 24. A portion of this planar wavefront passes through a cylindrical lens array 26 and a first baffle slit 30, producing multiple cylindrical wavefront 34 that is incident upon a hypotenuse face 38 of a right angle prism 40. Another portion of the planar wavefront passes through a second baffle slit 32, producing a smaller planar wavefront 36 that is also incident upon the hypotenuse face 38 of the right angle prism 40. A destructive interference between a reflected multiple cylindrical wavefront 92 and a direct planar wavefront 90 inside the prism 40 produces a curved grating pattern of monochromatic light on an adjacent prism face 42. This curved grating pattern of monochromatic light is projected toward the semiconductor wafer 12, thereby exposing the photoresist coated wafer surface 48 with the curved grating pattern.

24 Claims, 2 Drawing Sheets